United States Patent
Ma et al.

(10) Patent No.: US 10,043,767 B2
(45) Date of Patent: Aug. 7, 2018

(54) SEMICONDUCTOR DEVICE INCLUDING DUMMY CONDUCTIVE CELLS

(71) Applicant: TAIWAN SEMICONDUCTOR MANUFACTURING CO., LTD., Hsinchu (TW)

(72) Inventors: Wei-Yu Ma, Taitung (TW); Hui-Mei Chou, Zhudong Township (TW); Kuo-Ji Chen, New Taipei (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 106 days.

(21) Appl. No.: 14/062,845

(22) Filed: Oct. 24, 2013

(65) Prior Publication Data

US 2015/0115419 A1    Apr. 30, 2015

(51) Int. Cl.
*H01L 23/58* (2006.01)
*H01L 23/528* (2006.01)
*H01L 23/522* (2006.01)
*H01L 27/02* (2006.01)

(52) U.S. Cl.
CPC .......... *H01L 23/585* (2013.01); *H01L 23/522* (2013.01); *H01L 23/5286* (2013.01); *H01L 27/0207* (2013.01); *H01L 2924/0002* (2013.01)

(58) Field of Classification Search
CPC .................... H01L 23/5225; H01L 23/5286

USPC ................ 438/622, 926; 257/758, E23.144, 257/E23.151, E23.152, E23.153
See application file for complete search history.

(56) References Cited

U.S. PATENT DOCUMENTS

| 7,470,630 | B1 * | 12/2008 | Chen ................... H01L 21/3212 257/752 |
| 7,574,685 | B1 * | 8/2009 | Dong .................. G06F 17/5068 716/118 |
| 2002/0063335 | A1 * | 5/2002 | Ozawa ................ G06F 17/5077 257/758 |
| 2004/0088669 | A1 * | 5/2004 | Loh ..................... G06F 17/5068 257/773 |
| 2005/0110146 | A1 * | 5/2005 | Wang ............................ 257/758 |
| 2006/0166434 | A1 * | 7/2006 | Kinoshita ........... G06F 17/5068 438/253 |
| 2007/0222077 | A1 * | 9/2007 | Ogihara ..................... B41J 2/45 257/758 |
| 2007/0272949 | A1 * | 11/2007 | Shinomiya .......... G06F 17/5077 257/208 |
| 2009/0055792 | A1 * | 2/2009 | Itagaki ................ G06F 17/5068 716/129 |

* cited by examiner

*Primary Examiner* — Kimberly Rizkallah
*Assistant Examiner* — Maria Ligai
(74) *Attorney, Agent, or Firm* — McDermott Will & Emery LLP

(57) ABSTRACT

A method is disclosed that includes the operations outlined below. A plurality of dummy conductive cells that provide different densities are formed in a plurality of empty areas in a plurality of metal layers of a semiconductor device according to overlap conditions of the empty areas between each pair of neighboring metal layers.

20 Claims, 5 Drawing Sheets

SEMICONDUCTOR DEVICE INCLUDING DUMMY CONDUCTIVE CELLS

BACKGROUND

In semiconductor chips having low power and high performance, there are more and more power domains. If noise immunity in power lines and ground lines is not good enough, the integral signal communication cannot be guaranteed.

BRIEF DESCRIPTION OF THE DRAWINGS

The disclosure can be more fully understood by reading the following detailed description of various embodiments, with reference to the accompanying drawings as follows.

DETAILED DESCRIPTION

In the following description, specific details are presented to provide a thorough understanding of the embodiments of the present disclosure. Persons of ordinary skill in the art will recognize, however, that the present disclosure can be practiced without one or more of the specific details, or in combination with other components. Well-known implementations or operations are not shown or described in detail to avoid obscuring aspects of various embodiments of the present disclosure.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

Figure 1:
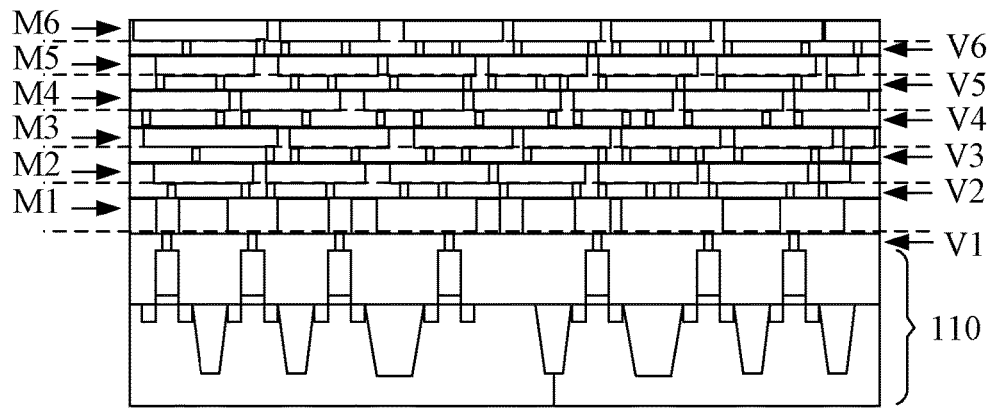
FIG. 1 is a schematic diagram of a semiconductor device in accordance with various embodiments of the present disclosure.

FIG. 1 is a schematic diagram of a semiconductor device 100 in accordance with various embodiments of the present disclosure. The semiconductor device 100 includes a device portion 110, metal layers M1-M6 and via layers V1-V6.

In some embodiments, the metal layers M1-M6 are formed on the device portion 110 and are electrically connected to the device portion 110. The metal layers M1-M6 include metal lines (not labeled) to connect different IC components in the device portion 110 together. The via layers V1-V6 connects different metal lines in different metal layers M1M6.

For illustration in FIG. 1, the metal layers M1-M6 include six layers that are labeled as M1, M2, M3, M4, M5 and M6 respectively. In some embodiments, the metal layers M1-M6 are grouped into pairs of neighboring metal layers, e.g., M1/M2, M3/M4 and M5/M6.

Figure 2:
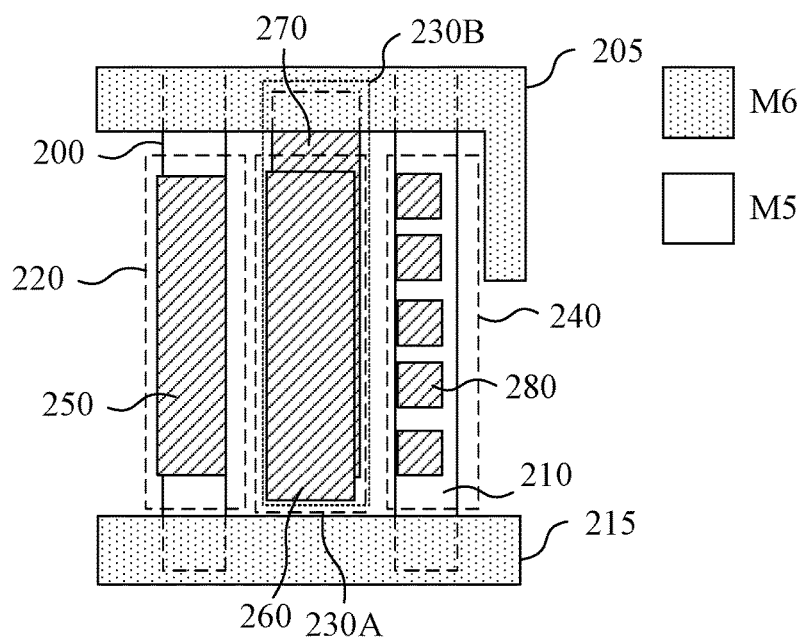
FIG. 2 is an exemplary diagram of a top view of the pair of neighboring metal layers in accordance with various embodiments of the present disclosure.

FIG. 2 is an exemplary diagram of a top view of the pair of neighboring metal layers M5 and M6 in accordance with various embodiments of the present disclosure.

For illustration in FIG. 2, a line 200 and a signal line 210 are presented in the metal layer M5. In some embodiments, the line 200 is either a power line or a ground line. Two signal lines 205 and 215 are presented in the metal layer M6.

In some embodiments, empty areas 220, 230A, 230B and 240 are the areas in each of the metal layers M5 and M6 that have no metal line passing through. Therefore, the empty area 220 is presented in metal layer M6 and is overlapped by the line 200 in metal layer M5. The empty area 230A enclosed by the dash line frame in FIG. 3B, is presented in metal layers M6. The empty area 230B enclosed by the dot line frame in FIG. 3B, is presented in metal layers M5. The empty area 230A and the empty area 230B are two overlapped empty areas. The empty area 240 is presented in metal layer M6 and is overlapped by the signal line 210 in metal layer M5.

A dummy conductive cell 250 is formed in the empty area 220 and overlaps the line 200. Two dummy conductive cells 260 and 270 are formed in the empty areas 230A and 230B in metal layers M6 and M5. In some embodiments, the empty area 230B in metal layer M5 extends longer than the empty area 230A in metal layer M6, and the dummy conductive cell 270 is formed larger than the dummy conductive cell 260. A group of dummy conductive cells 280 are formed in the empty area 240 in metal layer M6 and overlap the signal line 210.

In some embodiments, the area of each of the dummy conductive cells 280 are smaller and are separated to not fully cover the empty area 240. As a result, the group of dummy conductive cells 280 provides a density less than the density of the dummy conductive cells 250-270. Explained in a different way, the ratio between the total areas of the group of dummy conductive cells 280 and the empty area 240 is less than the ratio between the total areas of, for example, the dummy conductive cell 250 and the empty area 220.

In some embodiments, the material of the dummy conductive cells 250-280 includes metal. Effectively, each of the dummy conductive cells 250-280 forms a capacitor with either an overlapped metal line for transmitting power/signal or another overlapped dummy conductive cell in the neighboring metal layer. As a result, the dummy conductive cells 250-280 provide a decoupling effect to further provide noise immunity to the overlapped metal line such as the line 200 and the signal line 210.

Effectively, the dummy conductive cell 250 has a greater density and provides a greater decoupling effect to guarantee good noise immunity of the line 200 to ensure integral signal communication. The dummy conductive cells 260 and 270 not only provide a uniformity of the semiconductor device 100 illustrated in FIG. 1 when the overlapped empty areas 230A and 230B are presented in two neighboring layers M5 and M6, but also provide a greater decoupling effect to guarantee good noise immunity among the metal lines neighboring to the empty areas 230A and 230B. Moreover, the dummy conductive cell 280 having less density provides a lighter decoupling effect to provide noise immunity to the signal line 210 without interfering the signal transmission therein.

By forming the dummy conductive cells 250-280, the dummy conductive cells 250-280 provide a decoupling effect to guarantee good noise immunity of the metal lines in the metal layers M5 and M6. At the same time, the uniformity of the semiconductor device 100 is maintained after chemical-mechanical polishing (CMP) process. The process yield is thus enhanced. As a result, the capacitance in the metal layers M5 and M6 is increased to commit the chip power/ground integrity with an enhanced process yield. No additional area is needed to dispose additional capacitors.

In some embodiments, the dummy conductive cells are formed in other metal layers M1-M4 in FIG. 1 too. Various configurations of the dummy conductive cells and the metal lines in different metal layers M1-M4 are within the contemplated scope of the present disclosure.

In some embodiments, when there are metal layers in the semiconductor device 100 that are not paired with other metal layers, the dummy conductive cells of the larger density are formed in the empty areas in these metal layers.

The formation of dummy conductive cells is exemplarily illustrated below.

FIGS. 3A-3D are top views of the pair of neighboring metal layers M5 and M6 in different stages of the formation of the dummy conductive cells 250-280 in accordance with various embodiments of the present disclosure.

Figure 4:
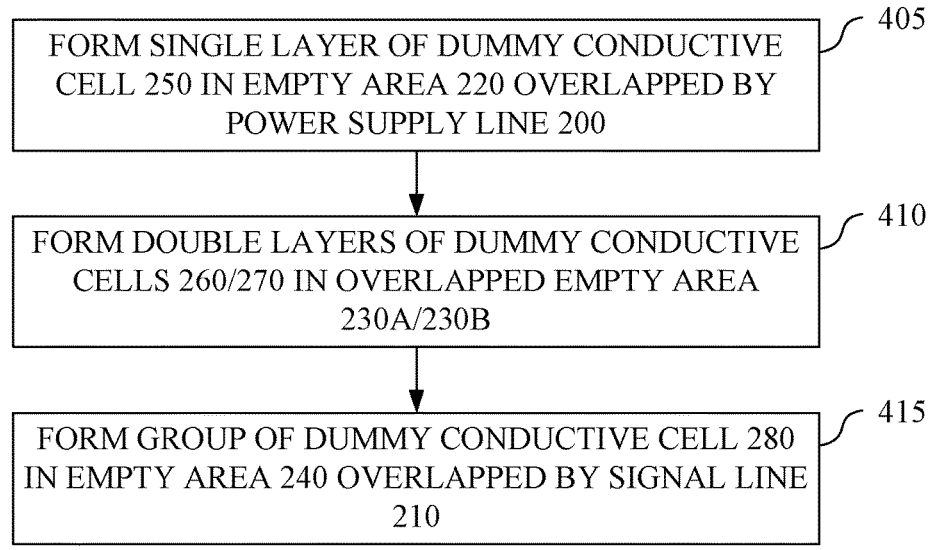
FIG. 4 is a flow chart of a method illustrating the process of forming the dummy conductive cells in the metal layers in FIG. 2, in accordance with various embodiments of the present disclosure.

FIG. 4 is a flow chart of a method 400 illustrating the process of forming the dummy conductive cells 250-280 in the metal layers M5 and M6 in FIG. 2, in accordance with various embodiments of the present disclosure.

For illustration, the formation of the dummy conductive cells 250-280 in FIG. 2 is described by the method 400 with reference to FIG. 3A-3D.

Figure 3A:
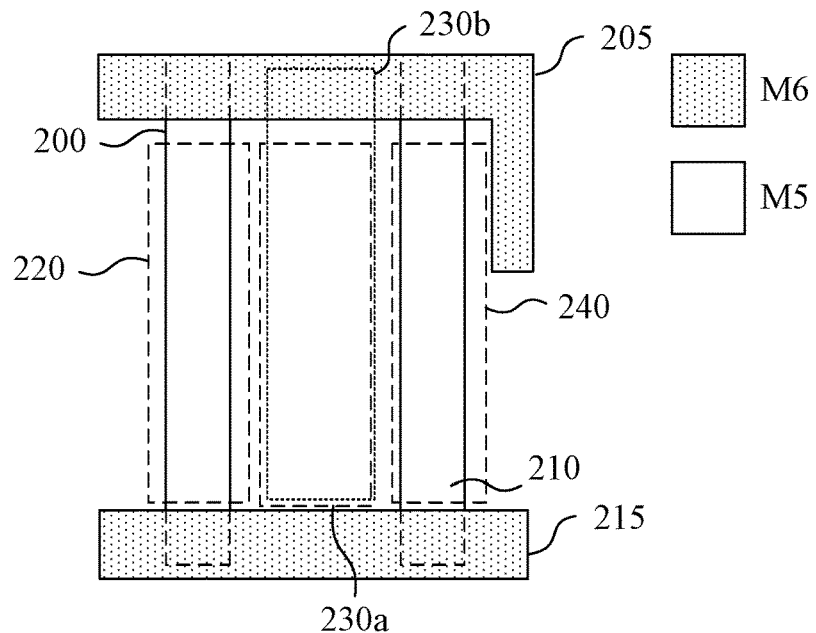
FIGS. 3A-3D are top views of the pair of neighboring metal layers in different stages of the formation of the dummy conductive cells in accordance with various embodiments of the present disclosure.
Figure 3B:
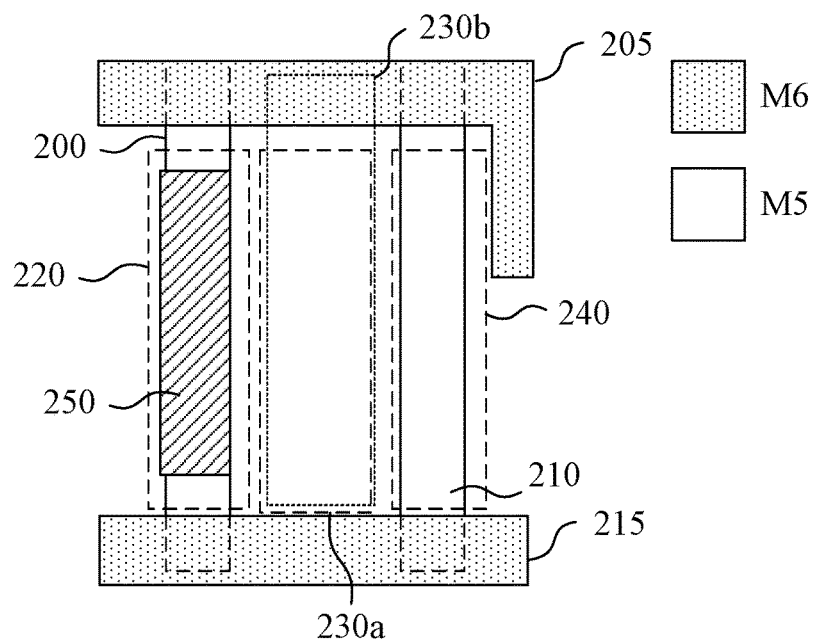

As shown in FIG. 3A, the metal layers M5 and M6 include empty areas 220, 230A, 230B and 240.

In operation 405, a single layer of the dummy conductive cell 250 is formed in the empty area 220, as illustrated in FIG. 3B, in which the overlap condition of the empty area 220 indicates that the empty area 220 is overlapped by the line 200 in the neighboring metal layer M5.

Figure 3C:
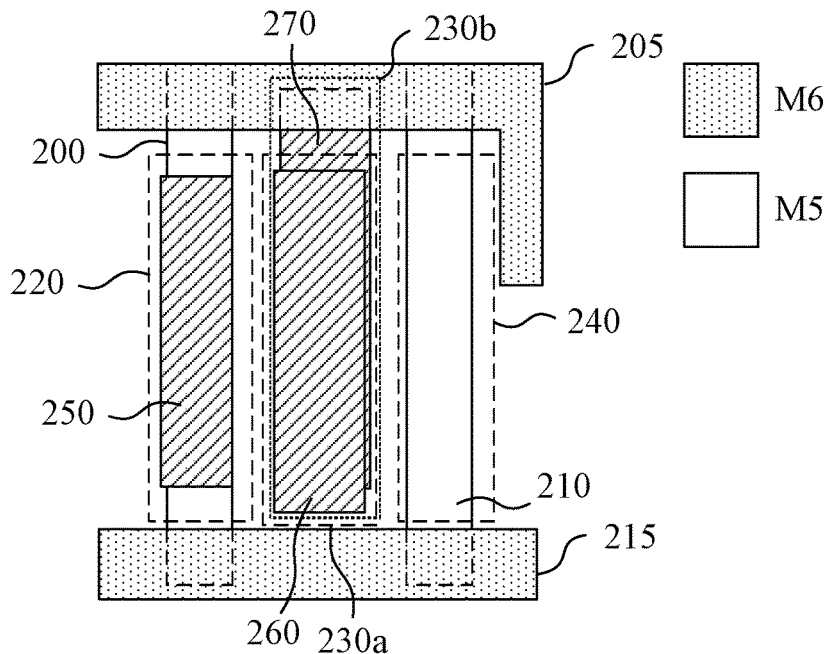

In operation 410, double layers of the dummy conductive cells 260 and 270 are formed in the two overlapped empty areas 230A and 230B respectively, as illustrated in FIG. 3C, in which the overlap conditions of the two empty areas 230A and 230B indicates that the empty areas 230A and 230B are two overlapped empty areas in two neighboring metal layers M5 and M6.

Figure 3D:
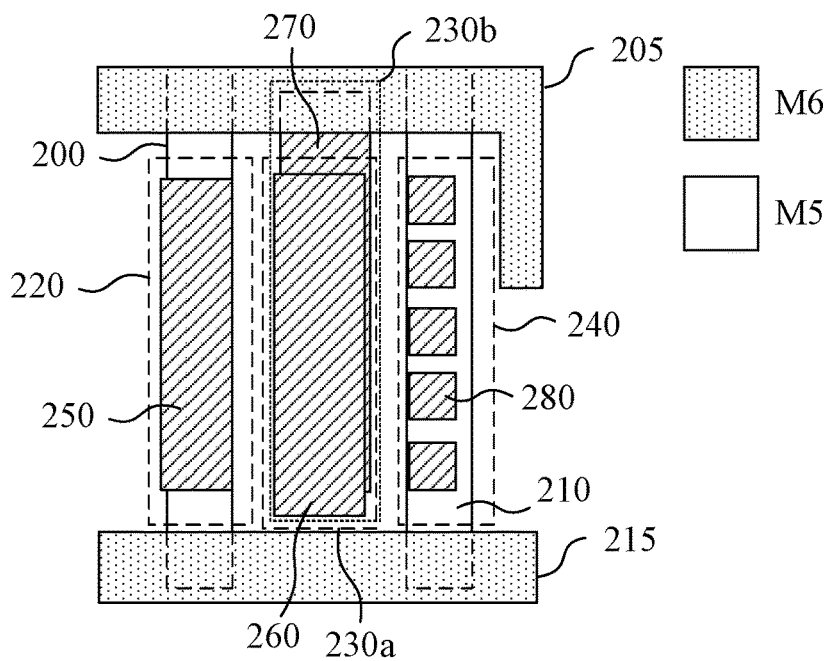

In operation 415, a group of independent dummy conductive cells 280 are formed in the empty area 240, as illustrated in FIG. 3D, in which the overlap conditions of the empty area 240 indicates that the empty area 240 is overlapped by the signal line 210 in the neighboring metal layer M5.

The configuration of metal layers M5 and M6 including the dummy conductive cells 250-280 is illustrated in FIG. 2.

In some embodiments, the dummy conductive cells in other pairs of neighboring metal layers such as M1/M2 and M3/M4 are formed by using the operations 405-415. Various configurations depend on the configurations of empty layers and metal lines in these pairs of neighboring metal layers.

Figure 5:
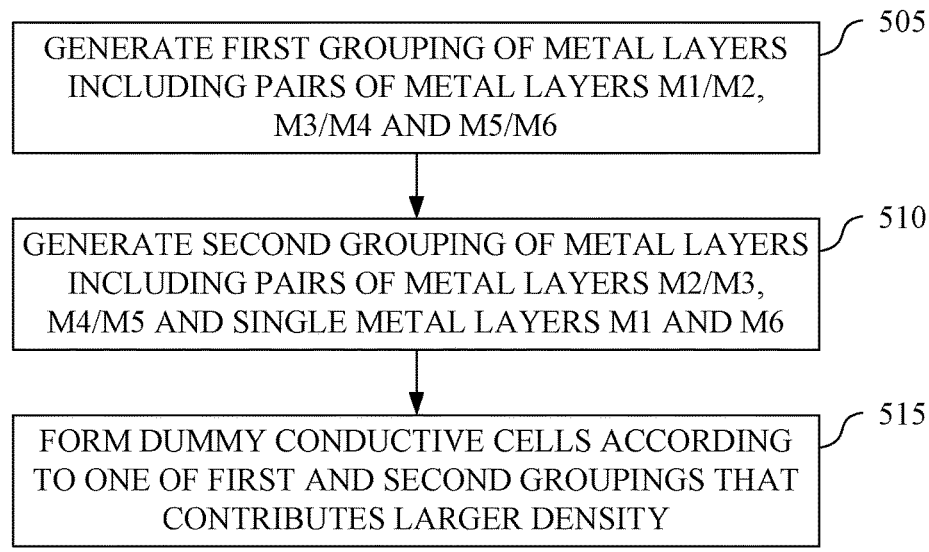
FIG. 5 is a flow chart of a method illustrating the process of forming the dummy conductive cells in the metal layers in FIG. 1, in accordance with various embodiments of the present disclosure.

FIG. 5 is a flow chart of a method 500 illustrating the process of forming the dummy conductive cells in the metal layers M1-M6 in FIG. 1, in accordance with some embodiments of the present disclosure.

In operation 505, a first grouping of the metal layers, that includes the pairs of metal layers M1/M2, M3/M4 and M5/M6, is generated.

In operation 510, a second grouping of the metal layers, that includes the pairs of metal layers M2/M3, M4/M5 and two single metal layers M1 and M6, is generated.

In operation 515, forming the dummy conductive cells according to one of the first grouping and the second grouping that has the overlap conditions contributing a larger density.

In some embodiments, the dummy conductive cells are formed by using the operations 405-415 illustrated in FIG. 4.

Based on the operations 505, 510 and 515, the empty areas in the metal layers M1-M6 of the semiconductor device 100 in different groups are evaluated. The dummy conductive cells are formed according to the evaluation result to accomplish the largest density to provide a better uniformity and noise immunity to the metal layers M1-M6.

Figure 6:
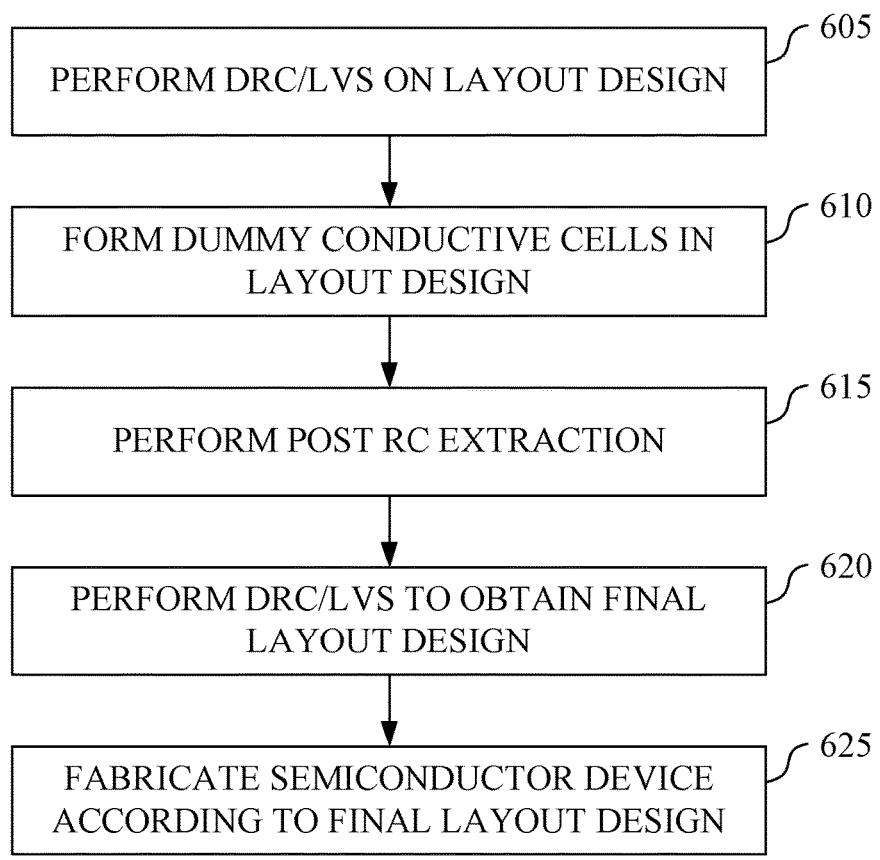
FIG. 6 is a flow chart of a method illustrating the process of forming the dummy conductive cells to the semiconductor device in FIG. 1, in accordance with various embodiments of the present disclosure.

FIG. 6 is a flow chart of a method 600 illustrating the process of forming the dummy conductive cells in the semiconductor device 100 in FIG. 1, in accordance with some embodiments of the present disclosure.

In operation 605, a verification process including the design rule check (DRC) and the layout versus schematic (LVS) is performed on a layout design of the semiconductor device 100. In some embodiments, the layout design of the semiconductor device 100 includes only the device portion 110 and the metal layers M1-M6. Further, the layout design of the semiconductor device 100 is formed by an auto place and route (APR) tool.

In operation 610, the dummy conductive cells in the metal layers M1-M4 are formed in the layout design of the semiconductor device 100 to generate a graphic data system (GDS) file. In some embodiments, the dummy conductive cells are formed by using the operations 305-315 illustrated in FIG. 3 and the operations 405, 410, and 415 illustrated in FIG. 4.

In some embodiments, after the generation of the GDS file, a Milky/LEF file is generated subsequently to allow the APR tool to read the file and perform the chip implantation flow to connect the dummy conductive cells. In some embodiments, pins are added on these dummy conductive cells such that the APR tool is able to identify the dummy conductive cells to perform the chip implantation flow.

In some embodiments, after the generation of the GDS file, the connection of the dummy conductive cells is performed manually.

In operation 615, a post RC (resistor and capacitor) extraction is performed on the layout design including the dummy conductive cells.

In operation 620, another verification process including the DRC and the LVS is performed again to obtain a final layout design of the semiconductor device 100.

In operation 625, the semiconductor device 100 is fabricated according to the final layout design.

Based on the aforementioned operations, the empty areas in the metal layers M1-M6 are analyzed during the design stage of the semiconductor device 100. The overlap conditions of the empty areas with the neighboring layers are thus determined. Subsequently, the dummy conductive cells with different densities are formed according to the overlap conditions during the fabrication process to provide the uniformity and the noise immunity to the metal layers M1-M6.

In some embodiments, a method is disclosed that includes the operations outlined below. A plurality of dummy conductive cells that provide different densities are formed in a plurality of empty areas in a plurality of metal layers of a semiconductor device according to overlap conditions of the empty areas between each pair of neighboring metal layers.

Also disclosed is a method that includes the operations outlined below. A plurality of metal layers of a semiconductor device are formed, wherein the metal layers comprise a plurality of empty areas and are grouped into a plurality pairs of neighboring metal layers. A plurality of first dummy conductive cells are formed, wherein each of the first dummy conductive cells is formed in each of the empty areas in each of the plurality pairs of neighboring metal layers that is overlapped by another empty area or a line in the same pair of neighboring metal layers. Groups of second dummy conductive cells are formed, wherein each group of second dummy conductive cells are formed in each of the empty areas in each of the plurality pairs of neighboring metal layers that is overlapped by a signal line in the same pair of neighboring metal layers.

Also disclosed is a semiconductor device. The semiconductor device includes a plurality of metal layers, a plurality of first dummy conductive cells and a plurality of groups of second dummy conductive cells. The plurality of metal layers comprises a plurality of empty areas and grouped into a plurality of pairs of neighboring metal layers. Each of the plurality of first dummy conductive cells is formed in each of the empty areas in each of the plurality pairs of neighboring metal layers that is overlapped by another empty area or a line in the same pair of neighboring metal layers. Each group of the second dummy conductive cells are formed in each of the empty areas in each of the plurality of pairs of neighboring metal layers that is overlapped by a signal line in the same pair of neighboring metal layer.

In this document, the term "connected" may be termed as "electrically connected", and the term "coupled" may be termed as "electrically coupled". "Connected" and "coupled" may also be used to indicate that two or more elements cooperate or interact with each other.

The number and configuration of metal layers in this document are for illustrative purposes. Various numbers and configurations of the metal layers are within the contemplated scope of the present disclosure.

The above illustrations include exemplary operations, but the operations are not necessarily performed in the order shown. Operations may be added, replaced, changed order, and/or eliminated as appropriate, in accordance with the spirit and scope of various embodiments of the present disclosure.

As is understood by one of ordinary skill in the art, the foregoing embodiments of the present disclosure are illustrative of the present disclosure rather than limiting of the present disclosure. It is intended to cover various modifications and similar arrangements included within the spirit and scope of the appended claims, the scope of which should be accorded with the broadest interpretation so as to encompass all such modifications and similar structures.

What is claimed is:

1. A method comprising:
    forming a plurality of dummy conductive cells that provides densities different from each other, in empty areas that are disposed in metal layers of a semiconductor device according to overlap conditions of the empty areas between each pair of neighboring metal layers of the metal layers,
    wherein the plurality of dummy conductive cells are formed after the empty areas in the metal layers of the semiconductor device are formed, and
    wherein in one of the overlap conditions in which a single empty area of the empty areas, in a first pair of neighboring metal layers of the metal layers, is overlapped by a signal line in the first pair of neighboring metal layers, forming the plurality of dummy conductive cells comprises:
        forming a group of dummy conductive cells that are separate from each other and vertically overlap the signal line, in the single empty area, wherein the signal line is formed in a first metal layer in the first pair of neighboring metal layers, and the group of dummy conductive cells that vertically overlap the signal line are formed in a second metal layer in the first pair of neighboring metal layers, wherein the second metal layer is separate from the first metal layer,
        wherein, when viewed in plan view, the entire projection areas of the group of dummy conductive cells are fully vertically overlapped by a projection area of the signal line.

2. The method of claim 1, wherein in one of the overlap conditions in which two overlapped empty areas of the empty areas are presented in one pair of neighboring metal layers of the metal layers, forming the plurality of dummy conductive cells comprises:
    forming two layers of dummy conductive cells in the two overlapped empty areas respectively.

3. The method of claim 2, wherein the group of dummy conductive cells provides a density less than that of the two layers of dummy conductive cells.

4. The method of claim 1, wherein material of at least one of the plurality of dummy conductive cells comprises metal.

5. The method of claim 1, further comprising:
    grouping each pair of neighboring metal layers of the metal layers by starting from a top metal layer of the metal layers, to generate a first grouping;
    grouping each pair of neighboring metal layers of the metal layers by starting from one of the metal layers, that is under the top metal layer, to generate a second grouping; and forming the plurality of dummy conductive cells according to one of the first grouping and the second grouping, that has a density larger than the other densities of the plurality of dummy conductive cells.

6. The method of claim 1, wherein in one of the overlap conditions in which a single empty area of the empty areas, in one pair of the neighboring metal layers, is overlapped by a line in the same pair of the neighboring metal layers, forming the plurality of dummy conductive cells comprises:
   forming a single layer of dummy conductive cells in the single empty area to form at least one capacitor between the single layer of dummy conductive cells and the line.

7. The method of claim 6, wherein the line is a power line or a ground line.

8. The method of claim 1, wherein a total area of the group of dummy conductive cells is smaller than a total area of the signal line.

9. A method comprising:
   forming metal layers of a semiconductor device, wherein the metal layers comprise empty areas and are grouped into pairs of neighboring metal layers;
   forming a plurality of first dummy conductive cells, after the empty areas in the metal layers of the semiconductor device are formed, in corresponding empty areas of the empty areas, in one pair of neighboring metal layers, of the pairs of neighboring metal layers, wherein at least one of the plurality of first dummy conductive cells is overlapped by another one of the plurality of first dummy conductive cells or a line in the same pair of neighboring metal layers to form at least one capacitor; and
   forming a plurality of groups of second dummy conductive cells, wherein one group of second dummy conductive cells, in the plurality of groups of second dummy conductive cells, are separate from each other and vertically overlap a signal line, and the signal line is formed in a first metal layer in a first pair of neighboring metal layers in the pairs of neighboring metal layers, and the group of second dummy conductive cells that vertically overlap the signal line is formed in a second metal layer in the first pair of neighboring metal layers, wherein the second metal layer is disposed above the first metal layer,
   wherein, when viewed in plan view, the entire projection areas of the one group of second dummy conductive cells are fully vertically overlapped by a projection area of the signal line.

10. The method of claim 9, wherein material of the plurality of first dummy conductive cells and the plurality of groups of second dummy conductive cells comprises metal.

11. The method of claim 9, wherein the line is a power line or a ground line.

12. The method of claim 9, wherein at least one of the plurality of groups of second dummy conductive cells provides a density less than that of each of the plurality of first dummy conductive cells.

13. The method of claim 9, further comprising:
   grouping each pair of neighboring metal layers of the metal layers by starting from a top metal layer of the metal layers, to generate a first grouping;
   grouping each pair of neighboring metal layers of the metal layers by starting from one of the metal layers, that is under the top metal layer, to generate a second grouping; and
   forming the plurality of first dummy conductive cells and the plurality of groups of second dummy conductive cells according to one of the first grouping and the second grouping, that has a density larger than other densities of the plurality of first dummy conductive cells and the plurality of groups of second dummy conductive cells.

14. A method comprising:
   forming metal layers comprising empty areas, wherein the empty areas are areas that have no metal line passing therethrough; and
   after the metal layers comprising the empty areas are formed, forming a plurality of dummy conductive cells in the empty areas, wherein the plurality of dummy conductive cells comprise a group of dummy conductive cells that are separate from each other and vertically overlap a signal line, in a single empty area of the empty areas, wherein the signal line is formed in a first metal layer in a pair of neighboring metal layers, and the group of dummy conductive cells that vertically overlap the signal line are formed in a second metal layer in the same pair of neighboring metal layers, wherein the second metal layer is separate from the first metal layer,
   wherein, when viewed in plan view, the entire projection areas of the group of dummy conductive cells are fully vertically overlapped by a projection area of the signal line.

15. The method of claim 14, wherein forming the metal layers comprises forming the metal layers comprising two overlapped empty areas in the same pair of neighboring metal layers.

16. The method of claim 14, wherein forming the metal layers comprises forming the metal layers comprising a single empty area overlapped by a line in the same pair of neighboring metal layers.

17. The method of claim 14, wherein forming the plurality of dummy conductive cells comprises:
   forming two layers of dummy conductive cells in two overlapped empty areas of the empty areas respectively.

18. The method of claim 14, wherein forming the plurality of dummy conductive cells comprises forming a group of dummy conductive cells that are separate from each other in one of the empty areas.

19. The method of claim 18, wherein the group of dummy conductive cells provides a density less than a density of the dummy conductive cells in the empty areas in the same pair of neighboring metal layers.

20. The method of claim 14, wherein material of the plurality of dummy conductive cells comprises metal.

* * * * *